US012381066B2

(12) United States Patent
Lewis, III

(10) Patent No.: US 12,381,066 B2
(45) Date of Patent: Aug. 5, 2025

(54) VAPOR INJECTION SYSTEM FOR A PLASMA REACTOR AND METHOD OF USE THEREOF

(71) Applicant: Nox Box Technologies LLC, Ormond Beach, FL (US)

(72) Inventor: Joseph E. Lewis, III, Ormond Beach, FL (US)

( * ) Notice: Subject to any disclaimer, the term of this patent is extended or adjusted under 35 U.S.C. 154(b) by 0 days.

(21) Appl. No.: 18/222,103

(22) Filed: Jul. 14, 2023

(65) Prior Publication Data

US 2025/0022687 A1   Jan. 16, 2025

(51) Int. Cl.
*H01J 37/32*   (2006.01)
*B05B 17/06*   (2006.01)
*F23D 11/34*   (2006.01)

(52) U.S. Cl.
CPC .... *H01J 37/32449* (2013.01); *B05B 17/0607* (2013.01); *F23D 11/345* (2013.01); *H01J 37/32458* (2013.01); *H01J 37/32935* (2013.01); *H01J 2237/327* (2013.01)

(58) Field of Classification Search
CPC ............... F23D 11/345; B05B 17/0607; H01J 37/32449; H01J 2237/327
See application file for complete search history.

(56) References Cited

U.S. PATENT DOCUMENTS

| 4,251,031 | A | * | 2/1981 | Martin | .................. F02M 69/041 310/326 |
| 5,753,196 | A | * | 5/1998 | Martens | .................... A61L 2/14 422/906 |
| 10,610,849 | B2 | | 4/2020 | Mango | |
| 2005/0139465 | A1 | * | 6/2005 | Kasuya | .................... A61L 2/035 204/275.1 |

FOREIGN PATENT DOCUMENTS

| JP | H08203758 A | * | 8/1996 |
| JP | 2015107279 A | * | 6/2015 |
| KR | 10-2050346 B1 | | 11/2019 |
| RU | 2780263 C1 | | 9/2022 |

* cited by examiner

*Primary Examiner* — Atif H Chaudry
(74) *Attorney, Agent, or Firm* — Lori Sandman, Esq.

(57) ABSTRACT

A vapor injection system and method of use thereof. The system including a fluid inlet in fluidic communication with a fluid reservoir, a voltage conditioner connected to a power source, where the voltage conditioner is configured to receive electrical energy from the power source, and transform the electrical energy, wherein transforming the electrical energy includes regulating voltage of the electrical energy and modifying frequency of the voltage, an iron core coil connected to the voltage conditioner, wherein the iron core is configured to transmit the transformed electrical energy from the voltage conditioner, a crystal compressor connected to the iron core coil and the fluid inlet, configured to: receive the transformed electrical energy from the iron core coil, receive the fluid from the fluid inlet, generate the vapor as a function of the transformed electrical energy and the fluid and output the vapor using a vapor outlet.

15 Claims, 7 Drawing Sheets

VAPOR INJECTION SYSTEM FOR A PLASMA REACTOR AND METHOD OF USE THEREOF

FIELD OF THE INVENTION

The present invention generally relates to the field of Non-thermal Plasma (NTP) technology. In particular, the present invention is directed to a vapor injection and method of use thereof.

BACKGROUND

High-capacity systems that can produce vapor at cooler temperatures with a high degree of accuracy are desirable for non-thermal systems.

SUMMARY OF THE DISCLOSURE

In an aspect, a vapor injection system that includes a fluid inlet in fluidic communication with a fluid reservoir, wherein the fluid inlet is configured to transport a fluid, a voltage conditioner connected to a power source, where the voltage conditioner is configured to: receive electrical energy from the power source and transform the electrical energy, wherein transforming the electrical energy comprises: regulating voltage of the electrical energy and modifying frequency of the voltage, a crystal compressor connected to the voltage conditioner and the fluid inlet, wherein the crystal compressor is configured to: receive the transformed electrical energy from the iron core coil, receive the fluid from the fluid inlet, generate the vapor as a function of the transformed electrical energy and the fluid and output the vapor using a vapor outlet.

In another aspect, a method for using a vapor injection system, wherein the method includes receiving, by a fluid inlet, a fluid from a fluid reservoir, receiving, by a voltage conditioner connected to a power source, electrical energy. The method also includes transforming, by the voltage conditioner, the electrical energy, wherein transforming the electrical energy comprises, regulating voltage of the electrical energy and modifying frequency of the electrical energy, generating, by a crystal compressor, vapor as function of the transformed electrical energy and the fluid and outputting, using a vapor outlet, the vapor.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to a vapor injection system and method of use thereof. In an embodiment, vapor injection system may be used to inject vapor into a plasma reactor.

Aspects of the present disclosure can be used to inject high volumes of vapor into a system that requires precision application.

Aspects of the present disclosure allow for growth media treatment under low temperature without damaging growth media through the use of vapor injection into a plasma reactor. Exemplary embodiments illustrating aspects of the present disclosure are described below in the context of several specific examples.

Now referring to FIG. 1, an exemplary embodiment of a vapor injection system 100 is presented. In an embodiment, system 100 includes a fluid inlet 104 in fluidic communication with a fluid reservoir 108. In an embodiment, fluid inlet 104 may receive a fluid from a fluid reservoir 108. A "fluid inlet," as used herein, is an entry point through which a fluid may be introduced into vapor injection system before for use in such manners described herein. In some nonlimiting examples, fluid inlet 104 may include components such as, without limitation, tubes, pipes, hoses, channels, or the like to create a continuous pathway for the flow of a fluid. "Fluidic communication," as used in this disclosure, refers to a pathway or link that enables the transfer of at least a fluid. As used herein, a "reservoir" is a storage system, for example, for a fluid. In embodiments, fluid inlet 104 may be configured to receive a fluid from fluid reservoir 108. In embodiments, fluid reservoir 108 may include a plurality of reservoirs. In an embodiment, fluid reservoir 108 may be sealed to substantially prevent leaking of the fluid stored in the fluid reservoir 108. In some embodiments, fluid reservoir 108 may be vented to allow for free passage of some fluids, such as without limitation air, into and out of the fluid reservoir 108. In another embodiment, fluid reservoir 108 may be completely sealed. In embodiments, fluid reservoir 108 may include a storage reservoir. In an embodiment, fluid reservoir 108 may include a pressure reservoir, providing for a pressure difference between inside and outside of the reservoir. In some cases, fluid reservoir 108 may be insulated, for example to prevent electrical and/or thermal communication between inside and outside the reservoir. In an embodiment, fluid inlet 104 may be hydraulically connected to fluid reservoir 108. In some embodiments, fluid inlet 104 may include a pump. In an embodiment, pump may be configured to unidirectionally pump fluid from fluid reservoir 108 to other components of vapor injection system 100. In some embodiments, the pump may include more than one pump and/or a number of valves. In an embodiment, the number of valves may comprise at least one check valve. As used in this disclosure, "check valve" is a one-way/nonreturn valve that opens with fluid movement and pressure and closes to prevent backflow of the fluid and/or pressure. In exemplary embodiment, check valve may be any of a ball check valve, swing check, tilting disc check valve, and the like It will be apparent to one of ordinary skill in the art, upon reading this disclosure, of the many ways that can be used to control the flow of fluids from fluid reservoir 108 to other components of vapor injection system 100. As used in this disclosure, a "fluid" is a gaseous or liquid material that can flow, including without limitation water, nitrogen, oxygen, and/or other gases and/or liquids.

Figure 1:
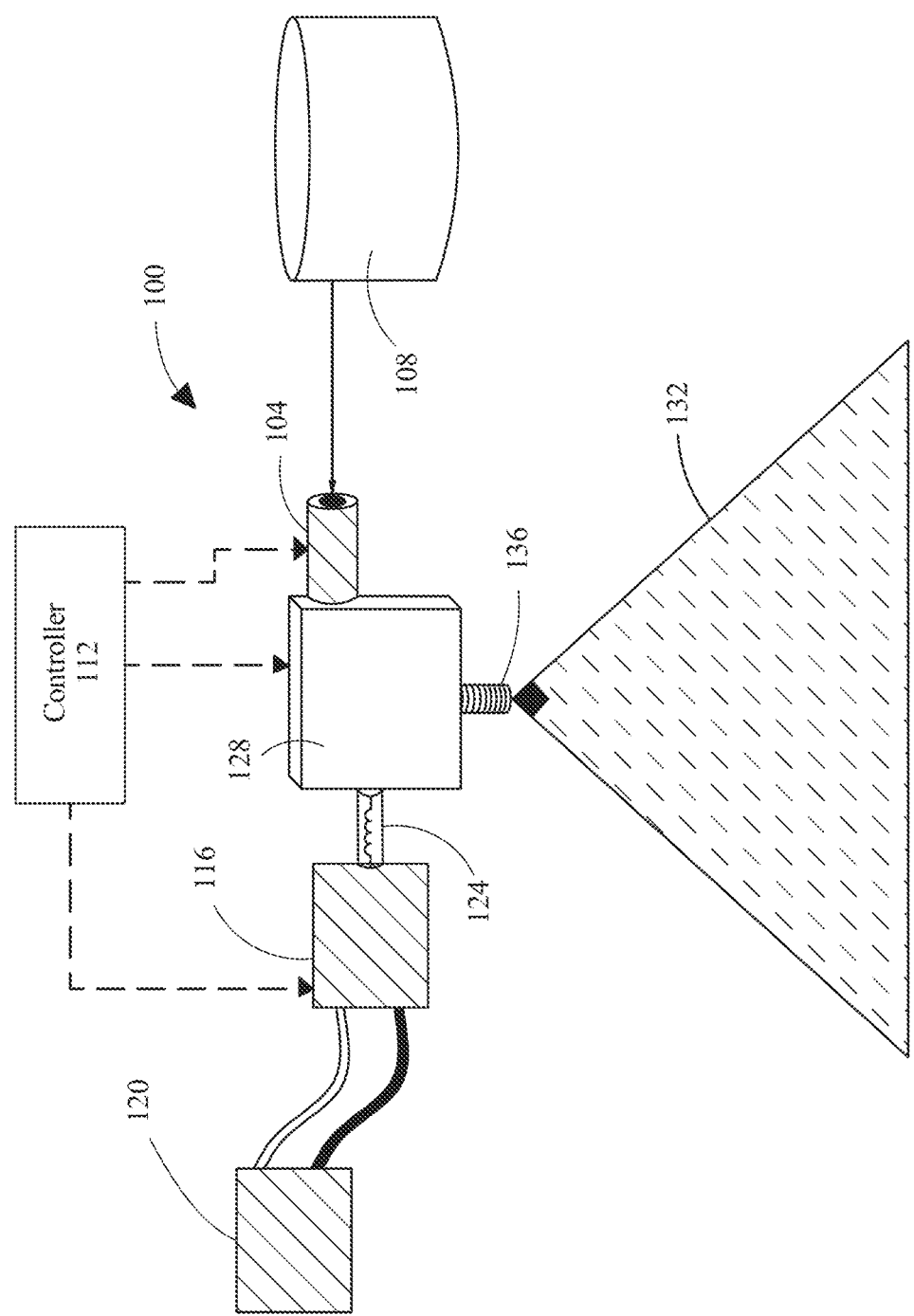
FIG. 1 is an exemplary embodiment of a vapor injection system for a plasma reactor.

Still referring to FIG. 1, in some embodiments, fluid inlet 104 may include a fluidic circuit configured to direct fluid into components of vapor injection system 100. In an embodiment, fluidic circuit may be connected to a controller 112 configured to control flow of fluid from fluid reservoir 108 to other components of vapor injection system 100. Controller 112 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Controller 108 may include a single computing device operating independently, or may include two or more computing device operating in concert, in parallel, sequentially or the like; two or more computing devices may be included together in a single computing device or in two or more computing devices. Controller 112 may interface or communicate with one or more additional devices as described below in further detail via a network interface device. Network interface device may be utilized for connecting controller 112 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Controller 108 may include but is not limited to, for example, a computing device or cluster of computing devices in a first location and a second computing device or cluster of computing devices in a second location. Controller 108 may include one or more computing devices dedicated to data storage, security, distribution of traffic for load balancing, and the like. Controller 112 may distribute one or more computing tasks as described below across a plurality of computing devices of computing device, which may operate in parallel, in series, redundantly, or in any other manner used for distribution of tasks or memory between computing devices. Controller 112 may be implemented using a "shared nothing" architecture in which data is cached at the worker, in an embodiment, this may enable scalability of system 100 and/or computing device.

With continued reference to FIG. 1, in embodiments, the controller 112 may be designed and/or configured to perform any method, method step, or sequence of method steps in any embodiment described in this disclosure, in any order and with any degree of repetition. For instance, controller 112 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Controller 108 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, controller 112 may send pump commands to a pump, for example by way of pump command signals. "Pump command signal," as used in this disclosure, is a signal representing a pump command. "Pump command," as used in this disclosure, is a communication intended for any pump described herein. In some cases, pump command may be used to affect performance of the pump. In some embodiments, controller 112 may receive pump data from a pump connected to fluid inlet 104, for example by way of pump data signals. As used in this disclosure, a "pump data signal" is a signal representing pump data. As used in this disclosure, "pump data" is information associated with any pump described herein. In some cases, pump data may represent performance and/or operation of a pump.

Continuing to refer to FIG. 1, system 100 may include a voltage conditioner 116 connected to a power source 120. A "voltage conditioner," as used herein is a device capable of regulating voltage levels and frequency of an electrical current and converting current types. In some embodiments, voltage conditioner 116 may include a rectifier. A "rectifier," as used herein, is a device or component configured to covert alternating current (AC) to direct current (DC). In some embodiments, voltage conditioner 116 may include an inverter. An "inverter," as used herein, is a device or component configured to convert direct current (DC) to alternating current (AC). In an embodiment, voltage conditioner 116 may include a boost converter. A "boost converter," as used herein, is a device or component configured to increase voltage levels of a current. A "transformer," as used herein, is a device configured to transfer electrical energy from one circuit to another circuit through electromagnetic induction. In an embodiment, voltage conditioner 116 is configured to receive electrical energy from the power source 120. A "power source," as used herein is a is any system, device, or means that provides power such as, without limitation, electric power to a device. In embodiments, power source 120 may include a power generator. In embodiments, power source 120 may include a power outlet connected to the power grid. In some embodiments, controller 112 may be connected to power source. In embodiments, voltage conditioner is further configured to transform the electrical energy. In some embodiments, transforming the electrical energy may include regulating voltage of the electrical energy. In further embodiments, transforming the electrical energy may include regulating voltage of the electrical energy to a range between 110 volts and 220 volts. In some embodiments, voltage conditioner 116 may include a transformer. In some embodiments, voltage conditioner 116 may use transformer to regulate the electrical energy. In embodiments, transforming the electrical energy may include modifying frequency of the voltage. In further embodiments, transforming the electrical energy may include modifying frequency of the voltage to 20 kilohertz (kHz). In some embodiments, transforming the electrical energy may include modifying frequency of the voltage to 30 kilohertz (kHz). In a nonlimiting example, voltage conditioner 116 may transform electrical energy by receiving AC electrical energy from power source 120, voltage conditioner 116 may convert the AC electrical energy to a DC electrical energy using a rectifier component, voltage conditioner 116 may then increase voltage to 220 v using a boost converter component and then increase frequency to 20 kHz using an inverter component. In some embodiments, voltage conditioner 116 may use rectifier to convert AC electrical energy to Pulsed DC electrical energy. In embodiments, voltage conditioner 116 may use rectifier in conjunction with a filter, amplifier and/or digital signal processor to convert AC electrical energy to multi-rate waveform. A "multi-rate waveform," as used herein, is a type of signal that have been sampled at multiple rates, wherein each rate corresponds to a specific frequency range of interest. In embodiments, multi-rate waveform may include a plurality of waveforms such as square waves, sawtooth waves, triangular waves, and the like. As used herein, "square waves" are periodic signals that alternate in a binary manner, such as 0 and 1. As used herein, "sawtooth waves" are periodic signals that have a linear rise and a sudden drop. As used herein, "triangular waves" are periodic signals that have a linear rise and a linear fall. In some embodiments, voltage conditioner 116 may convert DC electrical energy to AC electrical energy using an inverter. In some embodiments, voltage conditioner 116 may convert Pulsed DC electrical energy to AC electrical energy using an inverter. In an embodiment, voltage conditioner 116 may also convert AC to AC. For example, AC to AC converters may be used for converting the AC waveforms with one particular frequency and magnitude to AC waveform with another frequency at another magnitude. For example, an AC voltage controller may be a thyristor-based device which converts fixed alternating voltage directly to variable alternating voltage without a change in frequency. AC voltage controller may be a phase-controlled device and hence no force commutation circuitry may be required and natural or line commutation may be used. It will be apparent to one of ordinary skill in the art, upon reading this disclosure, that component described in this disclosure are described as examples only and that voltage conditioner 116 may include many other components not described herein and components may be used in other orders not described.

Continuing to refer to FIG. 1, in an embodiment, system 100 may include an iron core coil 124 connected to voltage conditioner 116. In some embodiments, voltage conditioner 116 may include iron core coil 124. In an embodiment, iron core coil 124 may be configured to transmit transformed electrical energy from voltage conditioner 116. In other embodiments, voltage conditioner 116 may be configured to transmit transformed electrical energy. An "iron core coil," as used herein is a type of inductor or magnetic component, consisting of a coil of wire wound around an iron or ferromagnetic core, that resists changes to the current flowing through it. In some embodiments, voltage conditioner 116 may include two or more coils of insulated wire that are wrapped around a common iron core. In a nonlimiting example, iron core coil 124 may transmit modified electrical energy from voltage conditioner 116.

Still referring to FIG. 1, in an embodiment, system 100 includes a crystal compressor 128. A "crystal compressor," as used herein, is a piezoelectric device used to generate pressure variations or ultrasonic waves within a fluid. A "piezoelectric device," as used herein, is a device that uses piezoelectric materials, such as certain types of crystals that can change their shape and/or dimension when an electric voltage is applied, to generate oscillating pressure waves or ultrasonic vibrations. In some embodiments, crystal compressor 128 may be connected to iron core coil 124. In a nonlimiting example, iron core coil 124 may be used to connect voltage conditioner 116 and crystal compressor 128 to maintain the properties of transformed electrical energy, such as set voltage and frequency, during transmission. In embodiments, crystal compressor 128 may be connected to fluid inlet 104. In some embodiments, crystal compressor 128 may be connected to voltage conditioner 116. In an embodiment, crystal compressor 128 may be configured to receive the transformed electrical energy from iron core coil 124. In embodiments, crystal compressor 128 may receive the transformed electrical energy from voltage conditioner 116. In embodiments, crystal compressor 128 may receive the fluid from the fluid inlet 104. In some embodiments, crystal compressor 128 may be communicatively connected to controller 112. In some embodiments, controller 112 may be a piezo controller. Piezo controller may include the "Open-Loop Piezo Controller" made by Thorlabs Inc., headquartered in Newton, New Jersey USA.

Continuing to refer to FIG. 1, in an embodiment, crystal compressor 128 generates vapor 132 as a function of the transformed electrical energy and the fluid. In a nonlimiting example, crystal compressor 128 may generate vapor 132, such as water vapor, through applying ultrasonic vibrations to a fluid, such as water. In some embodiments, crystal compressor outputs the vapor using a vapor outlet 136. A "vapor outlet," as used herein, is an exit point through which vapor is discharged. In a nonlimiting example, vapor outlet 128 may include a fog nozzle configured to output vapor. In some embodiments, vapor injection system 100 may be connected to a plasma reactor. In some embodiments, vapor injection system 100 may be further configured to output vapor to the plasma reactor. As used in this disclosure, a "plasma reactor" is a device configured to generate, sustain, and/or control plasma. "Plasma," for the purpose of this disclosure, refers to the fourth state of matter, in addition to solid, liquid, and gas. Plasma may include a partially ionized gas consisting of a mixture of ions, electrons, and/or neutral particles (i.e., atoms and molecules). In an embodiment, plasma may be formed when a vapor subject to high-energy source, such as, without limitation, heat, radiation, electric filed, and the like, causing the atoms or molecules in a vapor to become ionized by losing or gaining electrons. In embodiments, vapor may be inputted into plasma reactor using vapor injector system 100. In some embodiments, plasma may include non-thermal plasma (NTP), wherein the non-thermal plasma is a type of plasma in which the electron temperature is significantly higher than the temperature of the heavier ions and neutral particles. In this case, while the electrons in plasma have high kinetic energy, the overall temperature of the vapor may remain relatively low (e.g., often near room temperature of 20-22 C/68-72 F). Additionally, or alternatively, the energy distribution among particles within non-thermal plasma may not be in thermal equilibrium due to the electrons, being much lighter than ions and neutral particles, may gain energy more rapidly when subjected to an electric or magnetic field, leading to a higher electron temperature. On the other hand, heavier ions and neutral particles may move more slowly and remain cooler, resulting in low temperature of vapor.

Figure 2:
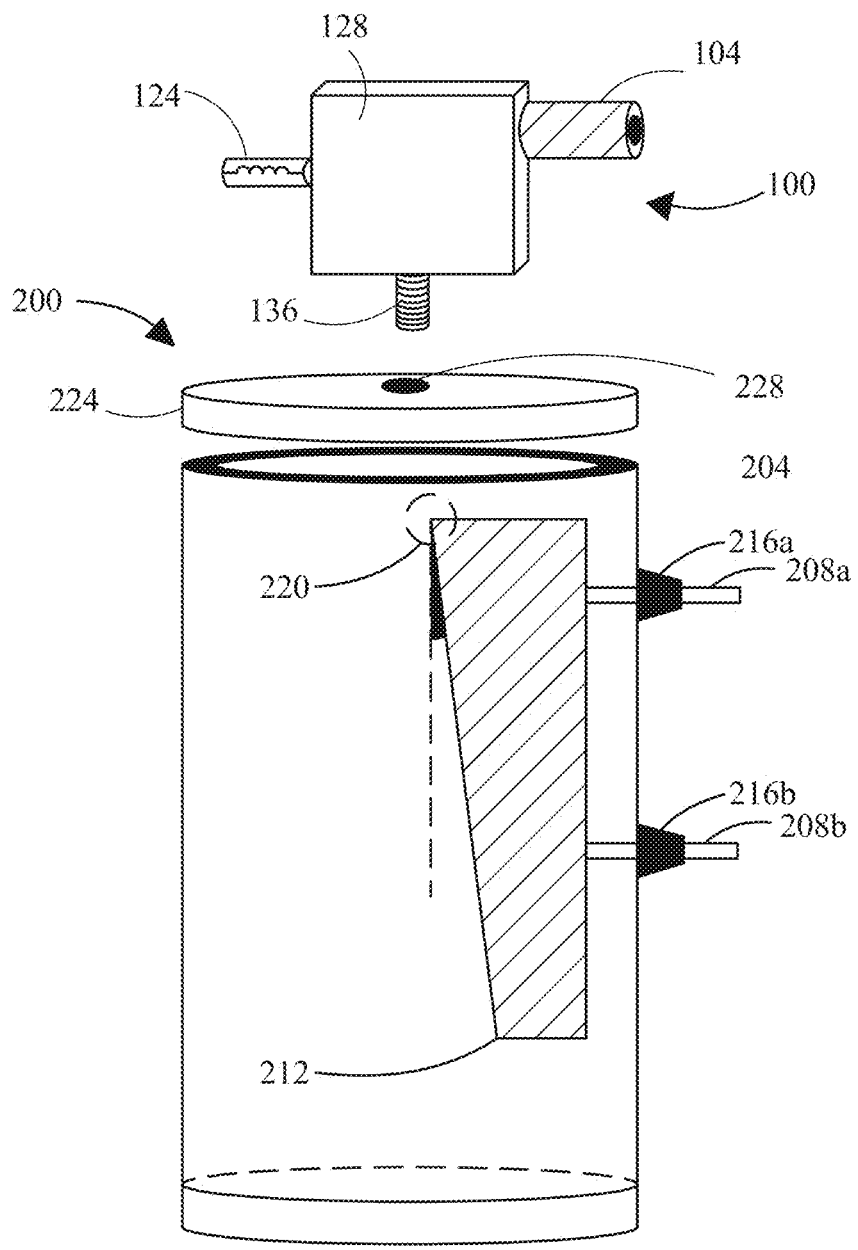
FIG. 2 is an exemplary embodiment of a plasma reactor assembly.

Now referring to FIG. 2, an exemplary FIG. 2 is an exemplary embodiment of a plasma reactor housing assembly 200. Plasma reactor housing assembly 200 may include a housing 204. In another embodiment, housing 204 may be a separate housing configured to only house a plasma reactor. In a non-limiting example, plasma reactor housing assembly 200 may be double-housed, wherein housing 204 may be disposed within another layer of housing 204. In some cases, housing 204 may be injection molded via an injectable mold. As used in this disclosure, an "injectable mold" is a manufacturing tool for producing plastic parts. Manufacturing housing 204 may include using an injection molding process, wherein the injection molding process may involve a use of injectable mold configured to create specific shape and features of housing 204. In some embodiments, injectable mold may include two halves that are clamped together, with one or more cavities in between, wherein the cavities may define the shape of housing 204. In some cases, material such as, without limitation, molten plastic may be injected into the injectable mold under high pressure, filling the space and taking on the shape of injectable mold. Injection molding process may include a cooling process which is configured to cool and/or solidify injected material. Injectable mold may be then opened and finished housing 204 may be removed. In some embodiments, injectable mold may be precisely machined to desired shape and size of housing 204. In a non-limiting example, housing 204 may include a hollow cylinder.

With continued reference to FIG. 2, in some embodiments, one or more continuous conductors 208a-b may pass through housing 204, with one end electrically connected to at least an electrode 212. An "electrode," as used herein, is a conductor that is used to make electrical contact with a conductive medium and/or a medium that can become conductive given a sufficient voltage differential, such as vapor as described above. In embodiments, at least an electrode 212 may include one or more electrodes 212. In embodiments, one or more electrodes 212 may be configured to produce an electrical discharge as a function of vapor 132. As used in this disclosure, an "electrical discharge" refers to a phenomenon where an electric current flows between two or more conductive surfaces (i.e., at least a pair of electrodes 212) through vapor 132, causing ionization and the subsequent release of energy in the form of light, heat, or sound. In an embodiment, another end of continuous conductor 208a-b may be connected to an ignition unit or ground connection. In some embodiments, one or more insulators 216a-b may be used at the point where continuous conductor 208a-b passes through housing 204. An "insulator," for the purpose of this disclosure, is a material that does not readily conduct heat, electricity, or sound. In a non-limiting example, insulators 216a-b may include electrical insulators, wherein the electrical insulators are material that have high electrical resistivity. Electrical insulators may not readily conduct electric current, thereby preventing the flow of electricity between a plasma reactor with other components, reducing the risk of short circuits, electrical shocks, interference, and the like. Exemplary electrical insulator may include plastics, ceramics, glass, rubber, and the like.

With continued reference to FIG. 2, each electrode of at least a pair of electrodes 212 may include a pitch angle 220. In a non-limiting example, at least an electrode 212 may include a pitch angle 220 of 12 degrees. As used in this disclosure, a "pitch angle" of an electrode refers to an angle between the electrode's longitudinal axis and a reference plane or axis within a plasma reactor. In some cases, pitch angle 220 may impact on characteristics of plasma generated between electrodes 212 in a reaction region of a plasma reactor such as, without limitation, electric field distribution, efficiency of electrical discharge process, interaction with reactive species (e.g., ROS, RNS, and the like) within the plasma.

With continued reference to FIG. 2, vapor injection system 100 may be connected to a plasma reactor within a plasma reactor housing assembly 200 via an injector mount flange 224. As used in this disclosure, an "injector mount flange" is a mechanical component used to securely attach vapor injection system 100 to housing 204 in a reliable and leak-proof manner. In a non-limiting example, injector mount flange 224 may include an interface 228 between vapor injection assembly 100 and a plasma reactor. In some cases, vapor outlet 132 of vapor injection system 100 may include a threaded adaptor. Both vapor outlet 132 and interface 228 may include a threaded section; for instance, and without limitation, vapor outlet 132/interface 228 may include a male/female threaded section, wherein the male and the female threaded section are compatible (i.e., matched). Vapor injection system 100 may be threaded, via vapor outlet 136 with threaded adaptor onto injector mount flange 224 at interface 228.

Figure 3:
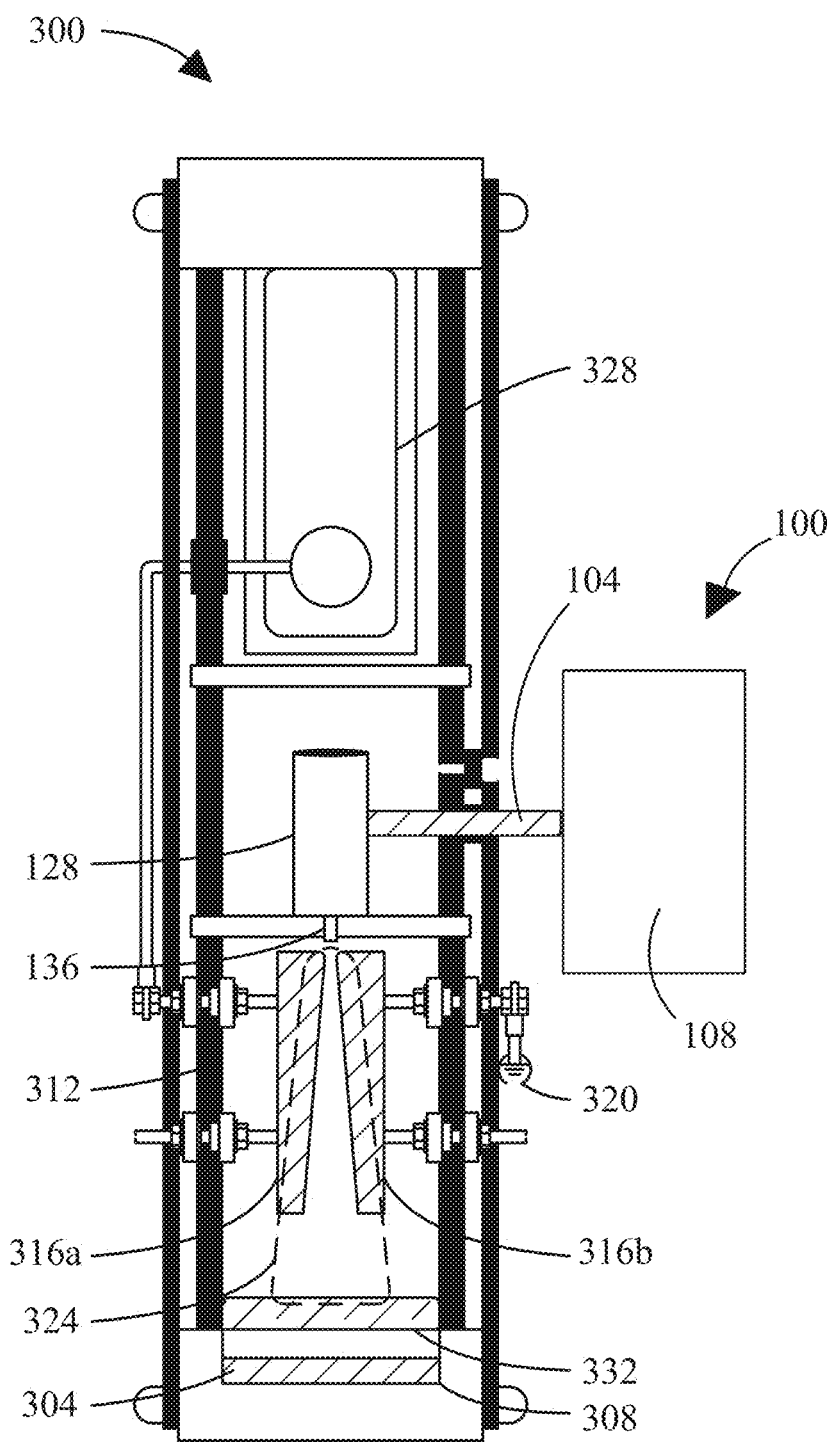
FIG. 3 is an exemplary embodiment of an internally mounted vapor injection system.

Referring now to FIG. 3, an exemplary embodiment of an apparatus 300 with an internally mounted vapor injection system 100 is illustrated. Apparatus 300 may include an internal injection system, such as vapor injection system 100, disposed within the apparatus 300. As used in this disclosure, an "internal injection system" is an injection system that is installed on an interior of apparatus 300. Injection system may be any injection system described in this disclosure. In some embodiments, internal injection system may be designed to deliver vapor 132 from fluid reservoir 108 into plasma reactor 412.

With continued reference to FIG. 3, apparatus 300 for treating a growth media 104 via an electrical discharge. Apparatus 300 may include a growth media 304 within treatment chamber 308. Apparatus 300 may include a plasma reactor 312. Plasma reactor 312 may include at least a pair of electrodes 316a-b. First electrode 316a may include anode electrically connected to an ignition unit and second electrode 316b may include cathode electrically connected to a ground 320. Plasma reactor 312 may include a reaction region 324 disposed between first electrode 316a and second electrode 316b. Apparatus 300 may include an ignition unit 328 electrically connected to at least an electrode of at least a pair of electrodes 316a-b. Apparatus 300 may further include a condenser 332 disposed within reaction region 324 above treatment chamber 308. Additional disclosure related to apparatus 300 may be found in U.S. patent application Ser. No. 18/222,080, filed on Jul. 14, 2023, and entitled, "APPARATUS FOR IMPROVED INJECTION FOR A PLASMA REACTOR," which is incorporated by reference herein in its entirety.

Figure 4:
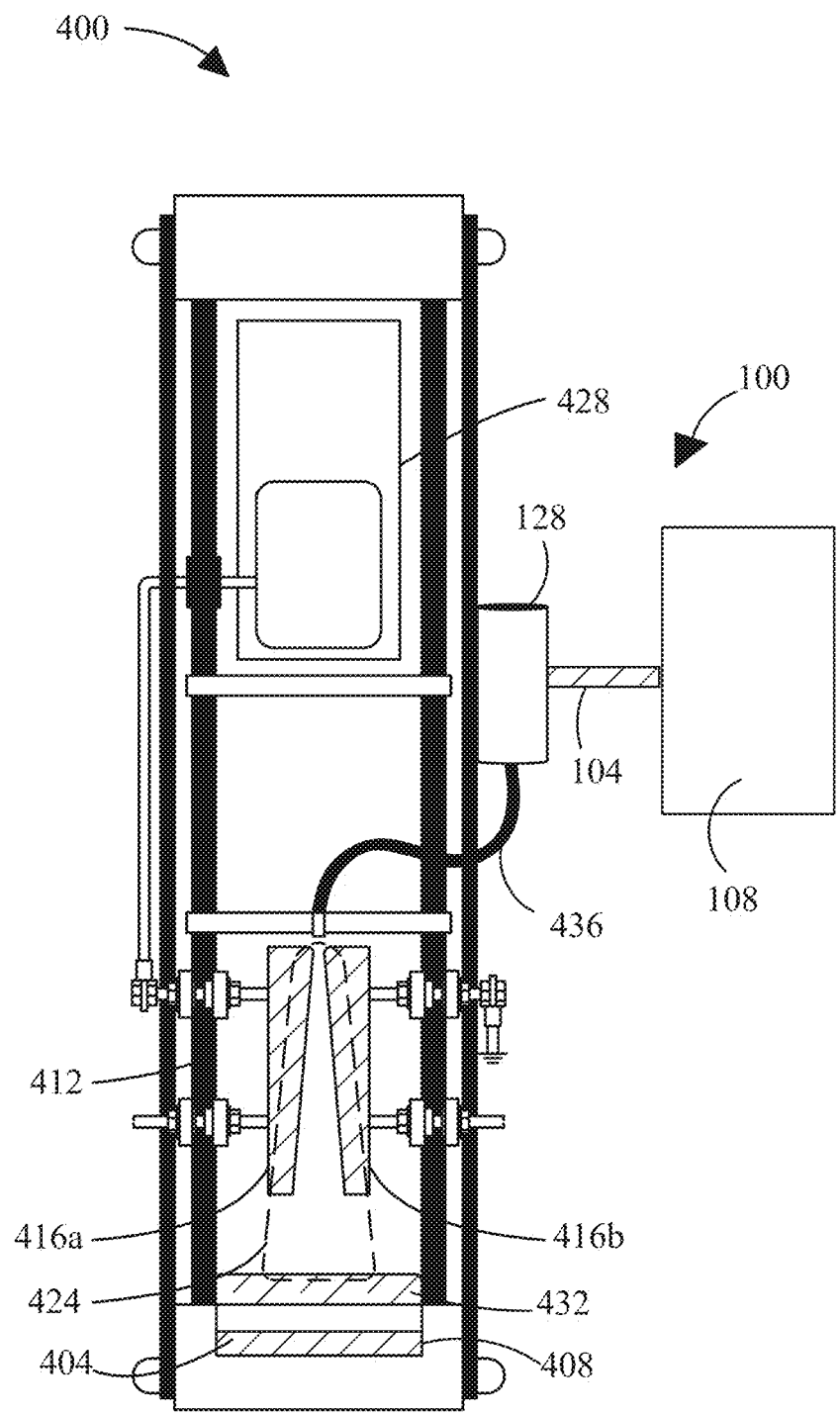
FIG. 4 is an exemplary embodiment of an externally mounted vapor injection system.

Referring now to FIG. 4, an exemplary embodiment of an apparatus 400 with an internally mounted vapor injection system 100 is presented. Apparatus 400 may include an externally mounted injection system, such as vapor injection system 100, disposed externally to the apparatus 400. As used in this disclosure, an "externally mounted injection system" is an injection system that is installed on an exterior of apparatus 400, rather than being integrated within apparatus 400 as described above with reference to FIG. 3. Injection system may be any injection system described in this disclosure. Apparatus 400 may include a growth media 404 within treatment chamber 408. Apparatus 400 may include a plasma reactor 412. Plasma reactor 412 may include at least a pair of electrodes 416*a-b*. First electrode 416*a* may include anode electrically connected to an ignition unit and second electrode 416*b* may include cathode electrically connected to a ground 420. Plasma reactor 412 may include a reaction region 424 disposed between first electrode 416*a* and second electrode 416*b*. Apparatus 400 may include an ignition unit 428 electrically connected to at least an electrode of at least a pair of electrodes 416*a-b*. Apparatus 400 may further include a condenser 432 disposed within reaction region 424 above treatment chamber 408.

Figure 5:
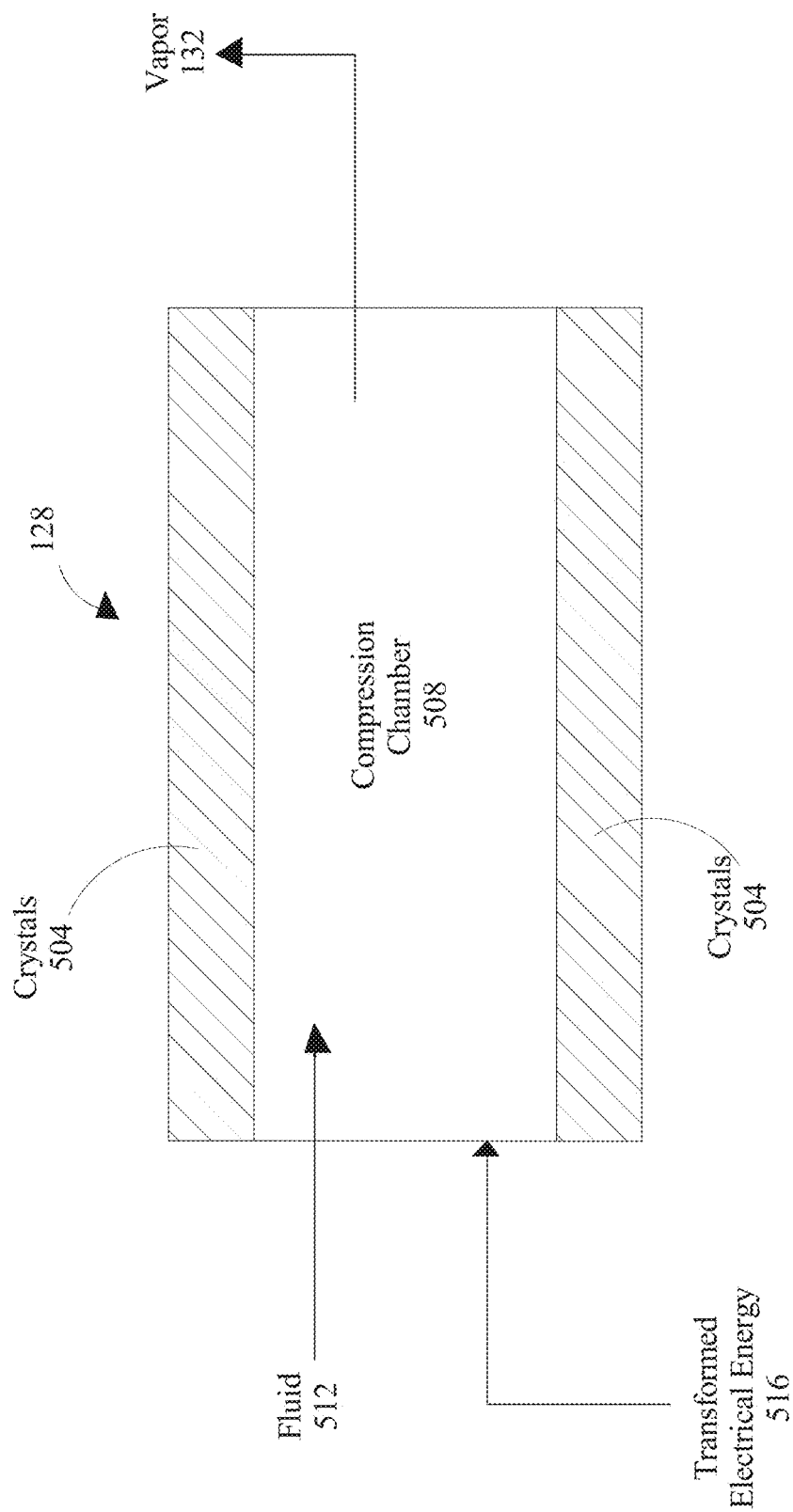
FIG. 5 is an exemplary depiction of a crystal compressor.

Now referring to FIG. 5, an exemplary block diagram 500 of a crystal compressor 128 is presented. In this exemplary embodiment, crystal compressor 128 includes crystals 504. In this exemplary embodiment, crystal compressor 128 includes a compression chamber 508. A "compression chamber," as used herein, is an enclosed component capable of withstanding high levels of pressure. In embodiments, compression chamber may receive a fluid 512. In an embodiment, compression chamber 508 may be in fluidic communication with fluid inlet 104. In an embodiment, crystals 504 may be activated by transformed electrical energy 516. In an embodiment, crystal compressor 128 may receive transformed electrical energy 516 from an iron core coil 124. In embodiments, crystal compressor 128 may receive transformed electrical energy 516 directly from voltage conditioner 116. In a nonlimiting example, crystals 504 may be activated by transformed electrical energy 516, where the activation causes the crystals 504 to generate ultrasonic pressure, fluid 512 may then change its state from liquid to vapor 132 as a function of the pressure generated by the crystals. In some embodiments, pressure levels generated by crystals 504 may be regulated through controller 112. In some embodiments, vapor 132 may exit compression chamber 508 through vapor outlet 136. It will be apparent to one of ordinary skill, upon reading this disclosure, that crystal compressor 128 is described as an example, and that crystal compressor 128 may include many embodiments of crystal compressors 128 not described in this disclosure.

Continuing to refer to FIG. 5, in some embodiments, system 100 may be a piezo water vapor injector. As used in this disclosure, a "piezo water vapor injector" is a type of injector, such as vapor injection system 100, that utilizes piezoelectric technology to generate water vapor by atomizing at least a liquid (i.e., second fluid) into fine droplets as described above. "Water vapor," as described herein, is the gaseous phase of water (i.e., second fluid), which occurs when water molecules gain enough energy to break free from liquid state and become dispersed in surrounding air (i.e., first fluid). "Piezoelectric technology," as described herein, is a technology based on a piezoelectric effect: a phenomenon where certain materials generated an electric charge when subjected to mechanical stress or other way around (i.e., undergo mechanical deformation when exposed to electric field). In some cases, materials such as ceramics (e.g., lead zirconate titanate), quartz crystals, polymers, and the like may exhibit such effect. Crystal compressor 128 may include a piezoelectric element; for instance, and without limitation, a ceramic disk or plate may be used to create mechanical vibrations at certain frequencies when an electrical voltage is applied by power source 120. Power source 120 may include any power source as described above in this disclosure such as a DC power supply. Mechanical vibrations may be transmitted to a fluid input from fluid inlet 104, thereby causing at least a fluid to break up into fine droplets of mist, which then evaporate to form water vapor.

Figure 6:
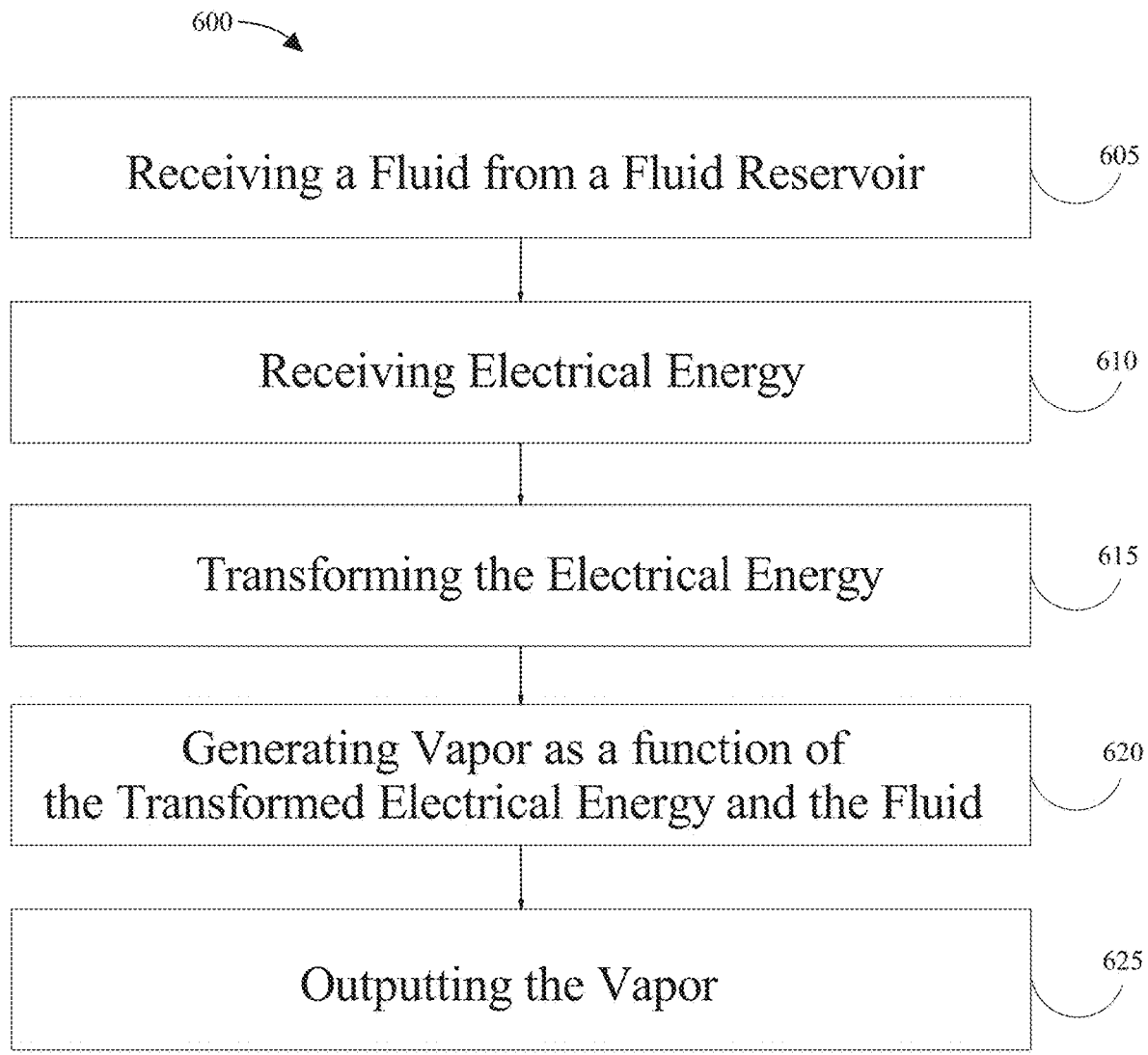
FIG. 6 is an exemplary embodiment of a method for using a vapor injection system.

Now referring to FIG. 6, a flow diagram of an exemplary embodiment of a method 600 for using vapor injection system 100 is presented. Method 600, at step 605, includes receiving, by fluid inlet 104 a fluid from fluid reservoir 108. In some embodiments, receiving the fluid includes using at least a pump. In some embodiments, at least a pump connected to fluid inlet 104 may be communicatively connected to controller 112. This may be implemented, without limitation, as described above in reference to FIGS. 1-5.

With continued reference to FIG. 6, method 600 includes, at step 610, receiving, by voltage conditioner 116, electrical energy from power source 120. In some embodiments, voltage conditioner 116 may be communicatively connected to controller 112. In a nonlimiting example, controller 112 may be used to regulate the quantity of electrical energy to be received from power source 120. This may be implemented, without limitation, as described above in reference to FIGS. 1-5.

With continued reference to FIG. 6, at step 615, method 600 includes transforming the electrical energy. In embodiments, transforming the electrical energy may include regulating voltage of the electrical energy. In further embodiments, regulating voltage of the electrical energy may include regulating voltage to a range between 110 volts and 220 volts. In some embodiments, transforming the electrical energy may include modifying frequency of the voltage. In further embodiments, modifying frequency may include modifying frequency to 20 kHz. In some embodiments, modifying frequency may include modifying frequency to 30 kHz. In some embodiments, voltage and/or frequency to be regulated, or modified, may be set by controller 112. This may be implemented, without limitation, as described above in reference to FIGS. 1-5.

With continued reference to FIG. 6, method 600 may include transmitting the transformed electrical energy by iron core coil 124. In some embodiments, method 600 may further include transmitting transformed electrical energy by iron core coil 124 to crystal compressor 128. In some embodiments, method 600 may include transmitting the transformed electrical energy directly from voltage conditioner 116 to crystal compressor 128. In an embodiment, voltage conditioner 116 includes iron core coil 124. In some embodiments, method 600 may include transmitting the transformed electrical energy by voltage conditioner 116. This may be implemented, without limitation, as described above in reference to FIGS. 1-5.

With continued reference to FIG. 6, at step 620, method 600 includes generating vapor 132, by crystal compressor 128, as a function of the transformed electrical energy and the fluid. In embodiments, generating vapor 132 may further include using a controller 112. In some embodiments, amount of fluid and/or modified electrical energy to be used may be set by controller 112. In some embodiments, This may be implemented, without limitation, as described above in reference to FIGS. 1-5.

With continued reference to FIG. 6, method 600, at step 625, includes outputting vapor 132 using vapor outlet 136. In some embodiments, method 600 may further include outputting vapor 132, using vapor outlet 136, to a plasma reactor. This may be implemented, without limitation, as described above in reference to FIGS. 1-5.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 7:
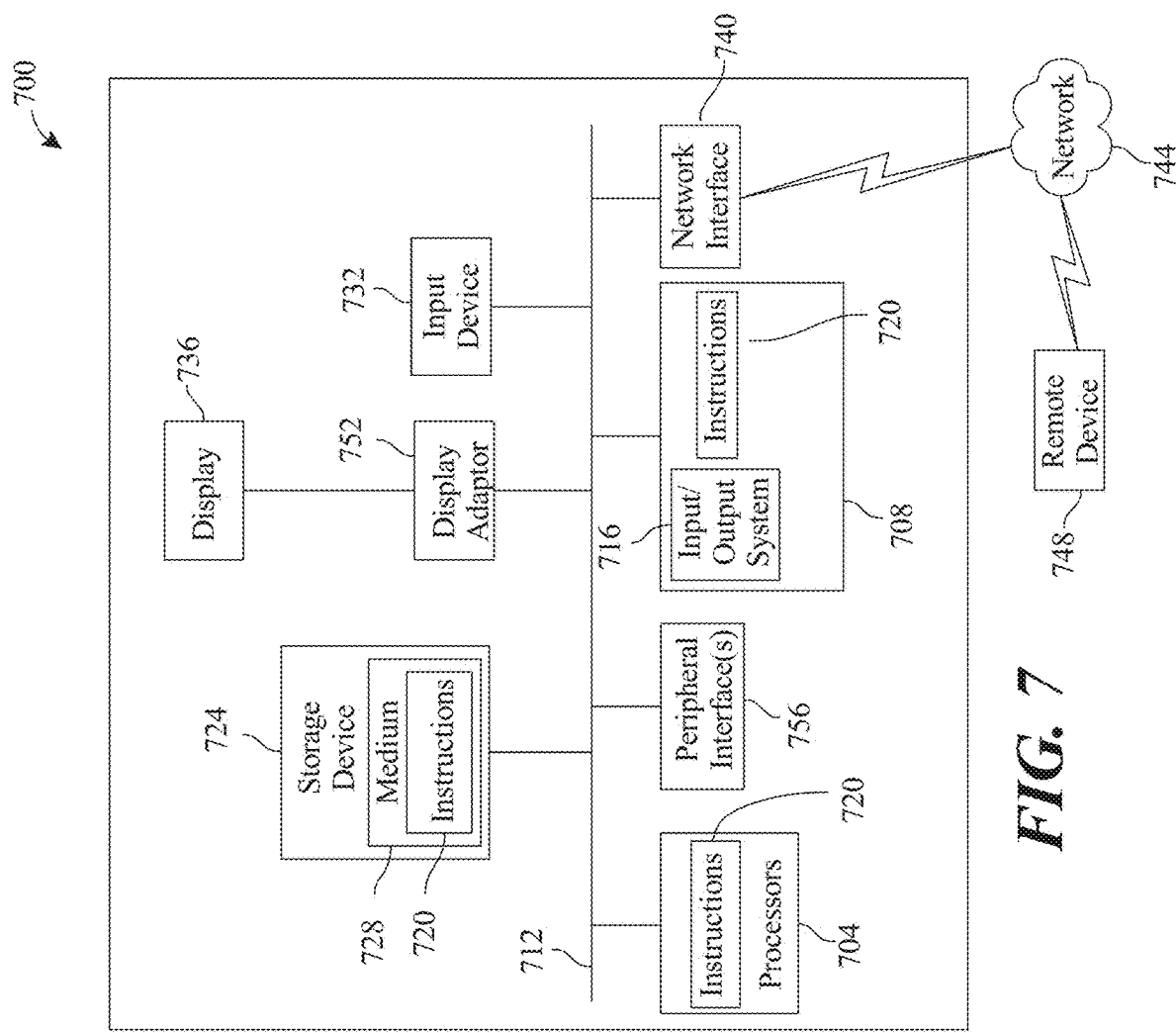
FIG. 7 is a block diagram of a computing system that can be used to implement any one or more of the methodologies disclosed herein and any one or more portions thereof.

FIG. 7 shows a diagrammatic representation of one embodiment of a computing device in the exemplary form of a computer system 700 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 700 includes a processor 704 and a memory 708 that communicate with each other, and with other components, via a bus 712. Bus 712 may include any of several types of bus structures including, but not limited to, a memory bus, a memory controller, a peripheral bus, a local bus, and any combinations thereof, using any of a variety of bus architectures.

Processor 704 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 704 may be organized according to Von Neumann and/or Harvard architecture as a non-limiting example. Processor 704 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 708 may include various components (e.g., machine-readable media) including, but not limited to, a random-access memory component, a read only component, and any combinations thereof. In one example, a basic input/output system 716 (BIOS), including basic routines that help to transfer information between elements within computer system 700, such as during start-up, may be stored in memory 708. Memory 708 may also include (e.g., stored on one or more machine-readable media) instructions (e.g., software) 720 embodying any one or more of the aspects and/or methodologies of the present disclosure. In another example, memory 708 may further include any number of program modules including, but not limited to, an operating system, one or more application programs, other program modules, program data, and any combinations thereof.

Computer system 700 may also include a storage device 724. Examples of a storage device (e.g., storage device 724) include, but are not limited to, a hard disk drive, a magnetic disk drive, an optical disc drive in combination with an optical medium, a solid-state memory device, and any combinations thereof. Storage device 724 may be connected to bus 712 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 724 (or one or more components thereof) may be removably interfaced with computer system 700 (e.g., via an external port connector (not shown)). Particularly, storage device 724 and an associated machine-readable medium 728 may provide nonvolatile and/or volatile storage of machine-readable instructions, data structures, program modules, and/or other data for computer system 700. In one example, software 720 may reside, completely or partially, within machine-readable medium 728. In another example, software 720 may reside, completely or partially, within processor 704.

Computer system 700 may also include an input device 732. In one example, a user of computer system 700 may enter commands and/or other information into computer system 700 via input device 732. Examples of an input device 732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 732 may be interfaced to bus 712 via any of a variety of interfaces (not shown) including, but not limited to, a serial interface, a parallel interface, a game port, a USB interface, a FIRE-WIRE interface, a direct interface to bus 712, and any combinations thereof. Input device 732 may include a touch screen interface that may be a part of or separate from display 736, discussed further below. Input device 732 may be utilized as a user selection device for selecting one or more graphical representations in a graphical interface as described above.

A user may also input commands and/or other information to computer system 700 via storage device 724 (e.g., a removable disk drive, a flash drive, etc.) and/or network interface device 740. A network interface device, such as network interface device 740, may be utilized for connecting computer system 700 to one or more of a variety of networks, such as network 744, and one or more remote devices 748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 744, may employ a wired and/or a wireless mode of communication. In general, any network topology may be used. Information (e.g., data, software 720, etc.) may be communicated to and/or from computer system 700 via network interface device 740.

Computer system 700 may further include a video display adapter 752 for communicating a displayable image to a display device, such as display device 736. Examples of a display device include, but are not limited to, a liquid crystal display (LCD), a cathode ray tube (CRT), a plasma display, a light emitting diode (LED) display, and any combinations thereof. Display adapter 752 and display device 736 may be utilized in combination with processor 704 to provide graphical representations of aspects of the present disclosure. In addition to a display device, computer system 700 may include one or more other peripheral output devices including, but not limited to, an audio speaker, a printer, and any combinations thereof. Such peripheral output devices may be connected to bus 712 via a peripheral interface 756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A vapor injection system for a plasma reactor, the system comprising:
   a fluid inlet in fluidic communication with a fluid reservoir, wherein the fluid inlet is configured to transport a fluid;
   a voltage conditioner connected to a power source, wherein the voltage conditioner is configured to:
   receive electrical energy from the power source; and
   transform the electrical energy, wherein transforming the electrical energy comprises: regulating voltage of the electrical energy; and
   modifying frequency of the voltage;
   a crystal compressor connected to the voltage conditioner and the fluid inlet, wherein the crystal compressor further comprises an iron core coil, and wherein the crystal compressor is configured to:
   receive the transformed electrical energy from the iron core coil;
   receive the fluid from the fluid inlet;
   generate the vapor as a function of the transformed electrical energy and the fluid; and
   output the vapor to the plasma reactor using a vapor outlet.

2. The system of claim 1, wherein the system is externally mounted to or internally integrated within the plasma reactor, and the injectors are further configured to output the vapor to the plasma reactor within a reaction region disposed between a first electrode and a second electrode.

3. The system of claim 1, wherein the fluid inlet comprises at least a pump.

4. The system of claim 3, wherein the at least a pump is communicatively connected to a controller.

5. The system of claim 1, wherein the crystal compressor is communicatively connected to a controller.

6. The system of claim 1, wherein voltage conditioner is communicatively connected to a controller.

7. The system of claim 1, wherein the crystal compressor is configured to receive transformed electrical energy using an iron core coil.

8. A method for using the vapor injection system of claim 1,
   wherein the method comprises: receiving, at a fluid inlet, a fluid from a fluid reservoir;
   receiving, at a voltage conditioner connected to a power source, electrical energy;
   transforming, using the voltage conditioner, the electrical energy, wherein transforming the
   electrical energy comprises:
   regulating voltage of the electrical energy; and
   modifying frequency of the electrical energy;
   generating, using the crystal compressor, vapor as function of the transformed electrical energy and the fluid; and
   outputting, using a vapor outlet, the vapor.

9. The method of claim 8, wherein the method further comprises outputting the vapor to the plasma reactor.

10. The method of claim 8, wherein receiving the fluid further comprises using at least a pump.

11. The method of claim 10, wherein the at least a pump is communicatively connected to a controller.

12. The method of claim 11, wherein generating the vapor further comprises using a controller.

13. The method of claim 8, wherein transforming electrical energy may further comprise using a controller.

14. The method of claim 8, wherein transforming the electrical energy comprise regulating voltage of the electrical energy to a range between 110 volts and 220 volts.

15. The method of claim 11, wherein the method comprises transmitting, by the iron core coil connected to the voltage conditioner, the transformed electrical energy to the crystal compressor.

* * * * *